(12) United States Patent
Lee

(10) Patent No.: US 9,053,772 B2
(45) Date of Patent: *Jun. 9, 2015

(54) METHOD FOR CONDUCTING REFERENCE VOLTAGE TRAINING

(75) Inventor: Jeong Hun Lee, Daejeon (KR)

(73) Assignee: SK Hynix Inc., Gyeonggi-do (KR)

( * ) Notice: Subject to any disclaimer, the term of this patent is extended or adjusted under 35 U.S.C. 154(b) by 600 days.

This patent is subject to a terminal disclaimer.

(21) Appl. No.: 13/315,483

(22) Filed: Dec. 9, 2011

(65) Prior Publication Data

US 2012/0147679 A1    Jun. 14, 2012

(30) Foreign Application Priority Data

Dec. 10, 2010    (KR) .................. 10-2010-0126445

(51) Int. Cl.
*G11C 5/14* (2006.01)
*G11C 7/10* (2006.01)

(52) U.S. Cl.
CPC .............. *G11C 5/147* (2013.01); *G11C 7/1087* (2013.01); *G11C 7/1084* (2013.01)

(58) Field of Classification Search
CPC ...... G11C 11/4099; G11C 5/147; G11C 7/14; G11C 7/1087; G11C 7/1084

USPC ................. 365/185.2, 189.09, 189.11, 210.1, 365/210.12, 210.14, 210.15

See application file for complete search history.

(56) References Cited

U.S. PATENT DOCUMENTS

| 7,710,791 | B2* | 5/2010 | Lee et al. ................. 365/189.05 |
| 8,593,886 | B2* | 11/2013 | Lee ............................ 365/189.05 |
| 2004/0004873 | A1* | 1/2004 | Rickes et al. ................. 365/201 |
| 2004/0006441 | A1* | 1/2004 | Rickes et al. ................. 702/118 |
| 2008/0112220 | A1* | 5/2008 | Lee et al. .................... 365/185.2 |

FOREIGN PATENT DOCUMENTS

| KR | 100776750 B1 | 1/2007 |
| KR | 10-0926621 B1 | 11/2009 |

* cited by examiner

*Primary Examiner* — J. H. Hur
(74) *Attorney, Agent, or Firm* — William Park & Associates Ltd.

(57) ABSTRACT

A method for conducting reference voltage training includes setting levels of a reference voltage in response to code signals and receiving and storing data for the respective levels of the reference voltage, and simultaneously outputting the stored data.

17 Claims, 10 Drawing Sheets

METHOD FOR CONDUCTING REFERENCE VOLTAGE TRAINING

CROSS-REFERENCES TO RELATED APPLICATIONS

The present application claims priority under 35 U.S.C. 119(a) to Korean Application Nos. 10-2010-0126445 filed on Dec. 10, 2010 and 10-2011-0117214 filed on Nov. 10, 2011, in the Korean Intellectual Property Office, which are incorporated herein by reference in their entireties set forth in full.

BACKGROUND

A semiconductor device uses various reference voltages to discriminate logic levels of inputted data or internal signals. It is important to correctly establish these reference voltages because these voltages serve as absolute values for discriminating the logic levels of data and internal signals. Further, these reference voltages are important because they are used to check level ranges for error checking data and internal signals.

Recently in the semiconductor field, a technique for training reference voltages includes finding a range of reference voltages which allow for normal operations. Reference voltage training is implemented such that the levels of a reference voltage are set according to a combination of code signals preset in a mode register set (MRS). Write and read operations are then performed according to the reference voltage set by the reference voltage training. Accordingly, in reference voltage training, code signals may have n bits, because there may be $2^n$ code signals, a reference voltage is set to $2^n$ different levels, and the write and read operations are performed $2^n$ times.

In the conventional reference voltage training, write and read operations are performed based on the number of combinations of the code signals. Consequently, as the number of bits increases, a time and an amount of current required for the reference voltage training increases in a geometrical progression.

SUMMARY

An embodiment of the present invention relates to a method for conducting reference voltage training, in which, after storing all the data inputted in response to reference voltages set for respective combinations of code signals, the stored data are simultaneously outputted through one read operation, so that a time required for reference voltage training can be shortened and current consumption can be reduced.

In one embodiment, a method for conducting reference voltage training includes: a first action of setting levels of a reference voltage in response to code signals and receiving and storing data for the respective levels of the reference voltage; and a second action of simultaneously outputting the stored data.

In another embodiment, a method for conducting reference voltage training includes: applying a first combination of codes; generating a write signal which is enabled by the first combination of codes, and performing a first write operation by receiving and storing data in response to a reference voltage with a first level which is generated by the first combination of codes; applying a second combination of codes; and generating a write signal which is enabled by the second combination of codes, and performing a second write operation by receiving and storing data in response to a reference voltage with a second level which is generated by the second combination of codes.

In another embodiment, a method for conducting reference voltage training includes: applying a plurality combination codes and a plurality of write commands; and generating a plurality of write signals enabled by the plurality of write commands, and performing a plurality of write operations by receiving and storing data in response to a plurality of reference voltages comprising a plurality of levels generated by the plurality of combination codes.

In another embodiment, a method for conducting reference voltage training includes: applying a first combination of codes from a control chip; generating a reference voltage with a first level by the first combination of codes; applying a first write command; generating a write signal which is enabled by the first write command, and performing a first write operation by receiving and storing data in response to the reference voltage with the first level; applying a second combination of codes; generating a reference voltage with a second level by the second combination of codes; applying a second write command; and generating a write signal which is enabled by the second write command, and performing a second write operation by receiving and storing data in response to the reference voltage with the second level.

Thanks to the above-described embodiments of the present invention, after storing all the data inputted in response to reference voltages set for respective combinations of code signals, the stored data are simultaneously outputted through one read operation. As a consequence, a time required for reference voltage training can be shortened and current consumption can be reduced.

Also, according to the embodiments of the present invention, a booting time may be shortened as the test time is shortened.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to the accompanying drawings. However, disclosed embodiments are for illustrative purposes only and are not intended to limit the scope of the invention.

Figure 1:
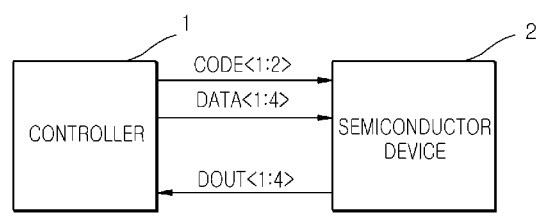
FIG. 1 is a block diagram showing a configuration of a semiconductor system in accordance with an embodiment of the present invention.

FIG. 1 is a block diagram showing a configuration of a semiconductor system in accordance with an embodiment of the present invention.

Referring to FIG. 1, a semiconductor system in accordance with the present embodiment includes a controller 1 configured to apply code signals CODE<1:2> for setting levels of a reference voltage and apply data DATA<1:4>. The controller 1 may also be configured to receive output data DOUT<1:4>. A semiconductor device 2 may be configured to receive and store the data DATA<1:4> for respective levels of the reference voltage, compress the stored data and output the output data DOUT<1:4>. The controller 1 initially applies the code signals CODE<1:2>, initialized to a combination of '00', to the semiconductor device 2. The controller 1 may apply the code signals CODE<1:2> to the semiconductor device 2 by up-counting the code signals CODE<1:2> one bit by one bit until the code signals CODE<1:2> become a combination of '11'. In the controller 1, the code signals CODE<1:2> are up-counted one bit by one bit in the sequence of combinations of '00', '01', '10' and '11'. The controller 1 receives the output data DOUT<1:4> when the code signals CODE<1:2> have the combination of '11'. Hereinbelow, a configuration of the semiconductor device 2 will be described in detail with reference to FIG. 2.

Figure 2:
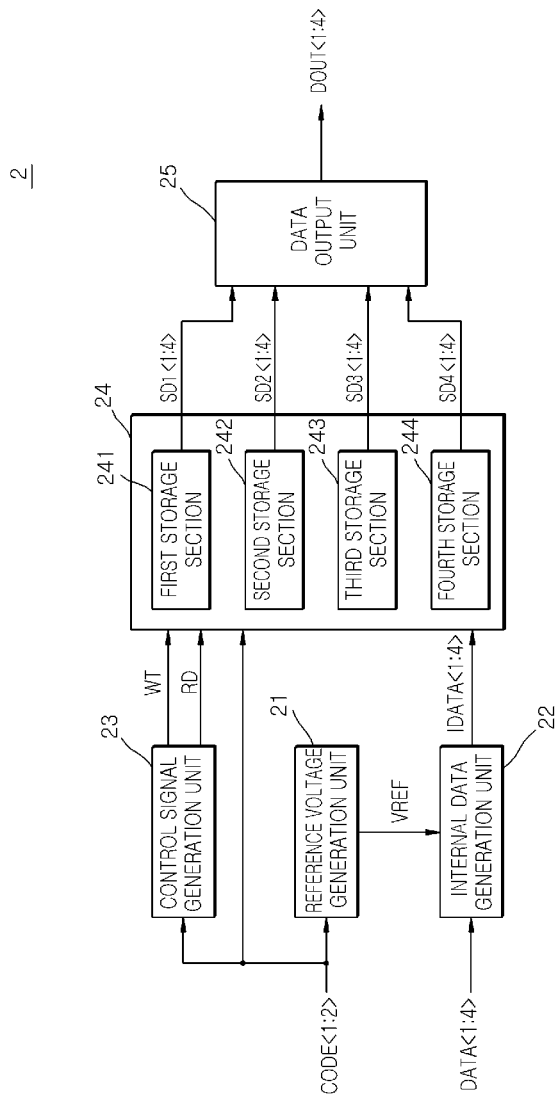
FIG. 2 is a block diagram showing a configuration of a semiconductor device included in the semiconductor system shown in FIG. 1.

Referring to FIG. 2, the semiconductor device 2 includes a reference voltage generation unit 21, an internal data generation unit 22, a control signal generation unit 23, a storage unit 24, and a data output unit 25. The storage unit 24 includes a first storage section 241, a second storage section 242, a third storage section 243 and a fourth storage section 244.

The reference voltage generation unit 21 is configured to generate a reference voltage VREF which has a level set according to a combination of the code signals CODE<1:2>. In detail, if code signals CODE<1:2> are set to '00' the generated reference voltage VREF may have a first level; if code signals CODE<1:2> are set to '01' the generated reference voltage VREF may have a second level; if code signals CODE<1:2> are set to '10' the generated reference voltage VREF may have a third level; and if code signals CODE<1:2> are set to '11' the generated reference voltage VREF may have a fourth level. A detailed configuration of the reference voltage generation unit 21 will be described later with reference to FIG. 3.

The internal data generation unit 22 is configured to compare the reference voltage VREF and the data DATA<1:4> for the respective levels of the reference voltage VREF and generate internal data IDATA<1:4>. The internal data generation unit 22 may comprise a plurality of comparators which compare the reference voltage VREF with respective bits of the data DATA<1:4> and output the internal data IDATA<1:4>. If the level of the reference voltage VREF comprises a level that is within range allowing for a normal operation, the internal data IDATA<1:4> generated by the internal data generation unit 22 are the same as the data DATA<1:4>.

The control signal generation unit 23 is configured to generate a write signal WT which is enabled and a read signal RD which is disabled when the code signals CODE<1:2> have the combinations of '00', '01' and '10'. Further, the control signal generation unit 23 is configured to generate the write signal WT and the read signal RD which are sequentially enabled when the code signals CODE<1:2> have the combination of '11'.

The storage unit 24 is configured to sequentially store the internal data IDATA<1:4> to the first to fourth storage sections 241 to 244 in response to the code signals CODE<1:2> when the write signal WT is enabled. In detail, the internal data IDATA<1:4> generated when the reference voltage VREF has the first level are stored in the first storage section 241. The internal data IDATA<1:4> generated when the reference voltage VREF has the second level are stored in the second storage section 242. The internal data IDATA<1:4> generated when the reference voltage VREF has the third level are stored in the third storage section 243. And the internal data IDATA<1:4> generated when the reference voltage VREF has the fourth level are stored in the fourth storage section 244.

When the read signal RD is enabled, the storage unit 24 outputs data stored in the first storage section 241 as first storage data SD1<1:4>, data stored in the second storage section 242 as second storage data SD2<1:4>, data stored in the third storage section 243 as third storage data SD3<1:4>, and data stored in the fourth storage section 244 as fourth storage data SD4<1:4>. The first storage section 241, the second storage section 242, the third storage section 243 and the fourth storage section 244 may be realized by storage circuits such as memory cells or registers which are generally known in the art.

The data output unit 25 is configured to compress the respective first storage data SD1<1:4>, second storage data SD2<1:4>, third storage data SD3<1:4> and fourth storage data SD4<1:4>, and generate the output data DOUT<1:4>. The respective bits included in the output data DOUT<1:4> may include information as to whether the levels of the reference voltage VREF set by the combinations of the code signals CODE<1:2> comprises a level that is within the range allowing for normal operation. For example, the output data DOUT<1> is generated as a logic high level when the first storage data SD1<1:4> has the same level as the data DATA<1:4>, meaning that the first level of the reference voltage VREF comprises a level that is within the range allowing for normal operation. A detailed configuration of the data output unit 25 will be described with reference to FIGS. 4 and 5.

Figure 3:
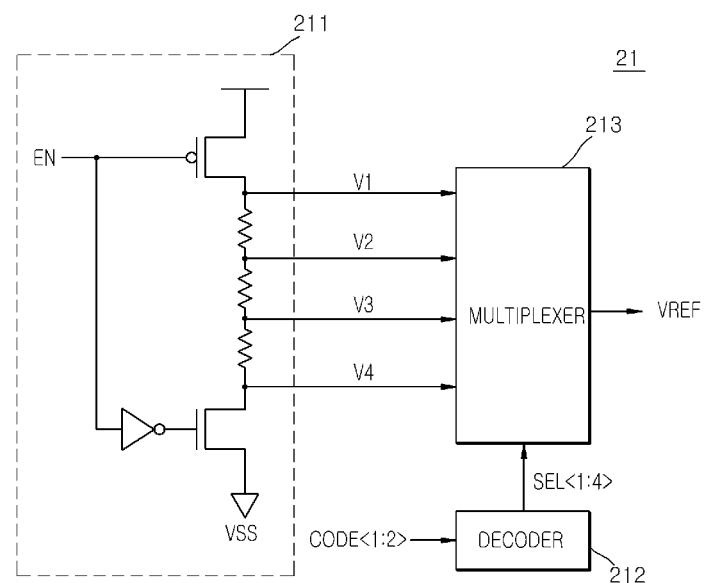
FIG. 3 is a view showing a configuration of a reference voltage generation unit included in the semiconductor device shown in FIG. 2.

Referring to FIG. 3, the reference voltage generation unit 21 includes a voltage dividing section 211 configured to perform a voltage dividing operation according to an enable signal EN and generate first to fourth voltages V1 to V4 respectively having first to fourth levels. The reference voltage generation unit 21 may also comprise a decoder 212 configured to decode the code signals CODE<1:2> and generate first to fourth select signals SEL<1:4> which are selectively enabled. The reference voltage generation unit 21 may further comprise a multiplexer 213 configured to selectively output the first to fourth voltages V1 to V4 as the reference voltage VREF in response to the first to fourth select signals SEL<1:4>.

The reference voltage generation unit 21 may generate a reference voltage VREF based on the select signal SEL<1:4> and code signals CODE<1:2>. For example, a first select signal SEL <1> is enabled if the code signals <1:2> are set to '00', accordingly the generated reference voltage VREF may have the first level. A second select signal SEL <2> is enabled if the code signals <1:2> are set to '01', accordingly the generated reference voltage VREF may have the second level.

A third select signal SEL <3> is enabled if the code signals <1:2> are set to '10', accordingly the generated reference voltage VREF may have the third level. And, a fourth select signal SEL <4> is enabled if the code signals <1:2> are set to '11', accordingly the generated reference voltage VREF may have the fourth level.

Figure 4:
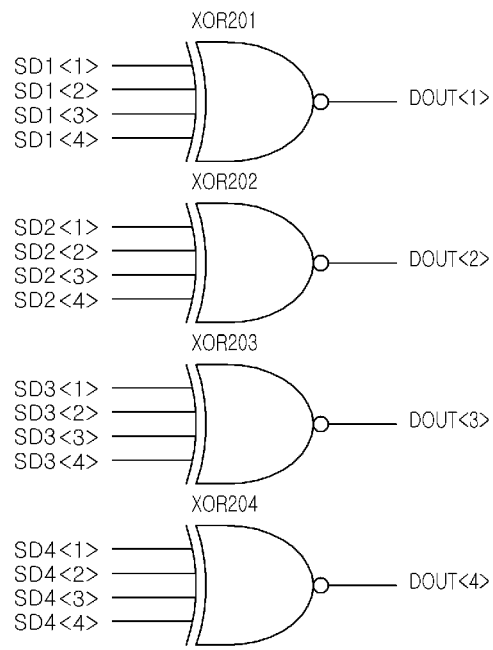
FIG. 4 is a view showing an Embodiment of a data output unit included in the semiconductor device shown in FIG. 2.

FIG. 4 is a view showing an Embodiment of the data output unit 25 included in the semiconductor device shown in FIG. 2.

Referring to FIG. 4, the data output unit 25 includes logic elements XOR201 to XOR204 which perform exclusive OR operations. The data output unit 25 configured in this way is used when all the bits of the data DATA<1:4> are inputted as the same logic level. That is to say, if all the data DATA<1:4> have a logic high level and all the levels of the reference voltage VREF comprise a level within a range allowing normal operation, all the bits of the first storage data SD1<1:4>, second storage data SD2<1:4>, third storage data SD3<1:4> and fourth storage data SD4<1:4> are generated as logic high levels, and all the bits of the output data DOUT<1:4> are generated as logic high levels. If the first level of the reference voltage VREF does not comprise a level within a range allowing normal operation, all the bits of the first storage data SD1<1:4> are not generated as a logic high level, and the output data DOUT<1> is generated as a logic low level. Similarly, if the second, third or fourth level VREF does not comprise a level within a range allowing for normal operation, the corresponding output data DOUT <2>,<3>, <4> is generated as a logic low level.

Figure 5:
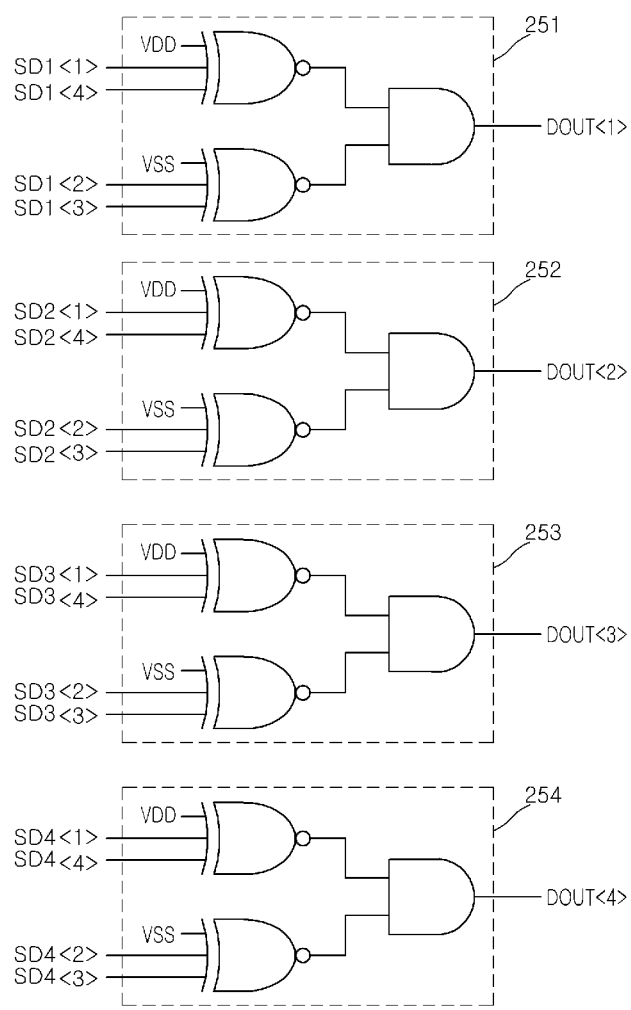
FIG. 5 is a view showing another Embodiment of a data output unit included in the semiconductor device shown in FIG. 2.

FIG. 5 is a view showing another Embodiment of the data output unit 25 included in the semiconductor device shown in FIG. 2.

Referring to FIG. 5, the data output unit 25 includes first to fourth output data generating sections 251 to 254 configured to generate the output data DOUT<1:4>. The data output unit 25 configured in this way is used in the case where the data DATA<1:4> are inputted as a logic low level, a logic high level, a logic high level and a logic low level.

Figure 6:
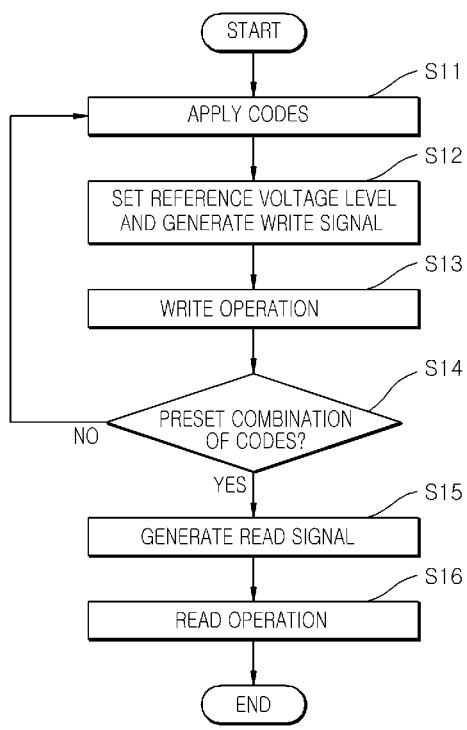
FIG. 6 is a flow chart explaining a reference voltage training process which is conducted by the semiconductor system shown in FIG. 1.

A reference training operation conducted in the semiconductor system configured as mentioned above will be described below with reference to FIG. 6.

First, the semiconductor device 2 is applied with the code signals CODE<1:2> which are initialized to the combination of '00' in the controller 1 (S11). The semiconductor device 2 may further generate the reference voltage VREF set to the first level and enable the write signal WT (S12), and perform a write operation by storing the internal data IDATA<1:4> to the first storage section 241 (S13).

Since the code signals CODE<1:2> do not have the preset combination of '11' (S14), the controller 1 up-counts the code signals CODE<1:2> by one bit to generate the combination of '01' and the controller 1 applies the resultant code signals CODE<1:2> to the semiconductor device 2. Steps S11 to S14, described above, are repeated. Accordingly, through these steps, the internal data IDATA<1:4> generated by the reference voltage VREF of the first level is stored in the first storage section 241, the internal data IDATA<1:4> generated by the reference voltage VREF of the second level is stored in the second storage section 242, the internal data IDATA<1:4> generated by the reference voltage VREF of the third level is stored in the third storage section 243, and the internal data IDATA<1:4> generated by the reference voltage VREF of the fourth level is stored in the fourth storage section 244.

If the code signals CODE<1:2> have the preset combination of '11', the read signal RD which is enabled is generated (S15), and the read operation is performed (S16). Namely, the data stored in the first to fourth storage sections 241 to 244 are outputted as the first to fourth storage data SD1<1:4> to SD4<1:4>, and the first to fourth storage data SD1<1:4> to SD4<1:4> are compressed and outputted as the output data DOUT<1:4>.

Finally, the controller 1 receives the output data DOUT<1:4>, checks the level range of the reference voltage VREF allowing for normal operation, and sets the level of the reference voltage VREF. In other words, in the case where only the output data DOUT<4> among the output data DOUT<1:4> has a logic low level, the levels of the reference voltage VREF allowing for normal operation become the first level, the second level and the third level. Thus, the controller 1 sets the level of the reference voltage VREF to one of the first level, the second level and the third level.

In the semiconductor system in accordance with the present embodiment, after storing all the data inputted in response to reference voltages set for respective combinations of code signals, the stored data are simultaneously outputted through one read operation. As a consequence, a time required for reference voltage training can be shortened and current consumption can be reduced.

Figure 7:
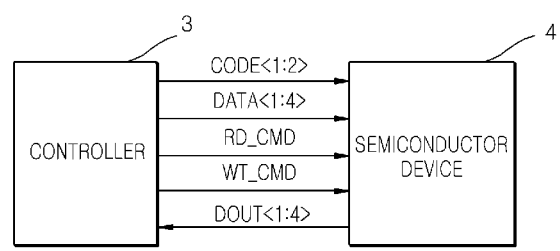
FIG. 7 is a block diagram showing a configuration of a semiconductor system in accordance with another embodiment of the present invention.

FIG. 7 is a block diagram showing a configuration of a semiconductor system in accordance with another embodiment of the present invention.

Referring to FIG. 7, the semiconductor system in accordance with the present embodiment includes a controller 3 configured to apply code signals CODE<1:2> for setting the levels of a reference voltage, data DATA<1:4>, a read command RD_CMD and a write command WT_CMD and receive output data DOUT<1:4>. The semiconductor system may also comprise a semiconductor device 4 configured to receive and store the data DATA<1:4> for the respective levels of the reference voltage set according to the code signals CODE<1:2>. The semiconductor device 4 may compress the stored data and output the output data DOUT<1:4>. The controller 3 initially applies the code signals CODE<1:2> initialized to a combination of '00' to the semiconductor device 4, and then applies the code signals CODE<1:2> to the semiconductor device 4 by up-counting the code signals CODE<1:2> one bit by one bit until the code signals CODE<1:2> become a combination of '11'. In the controller 3, the code signals CODE<1:2> are up-counted one bit by one bit in the sequence of combinations of '00', '01', '10' and '11'. Also, the controller 3 receives the output data DOUT<1:4> when the code signals CODE<1:2> have the combination of '11'. Hereinbelow, a configuration of the semiconductor device 4 will be described in detail with reference to FIG. 8.

Figure 8:
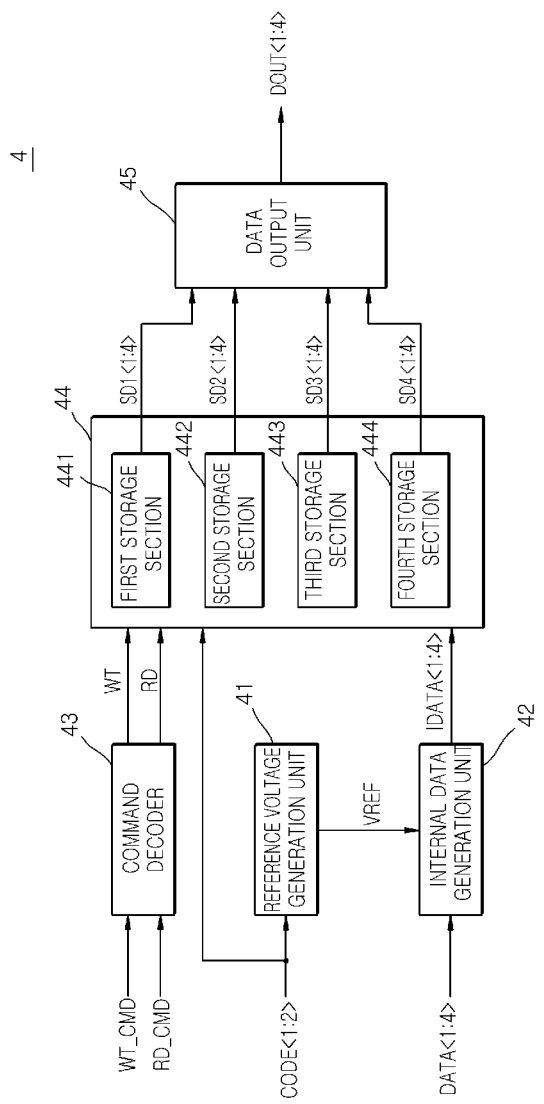
FIG. 8 is a block diagram showing a configuration of a semiconductor device included in the semiconductor system shown in FIG. 7.

Referring to FIG. 8, the semiconductor device 4 includes a reference voltage generation unit 41, an internal data generation unit 42, a command decoder 43, a storage unit 44, and a data output unit 45. The storage unit 44 includes a first storage section 441, a second storage section 442, a third storage section 443 and a fourth storage section 444.

The reference voltage generation unit 41 is configured to generate a reference voltage VREF which has a level set according to a combination of the code signals CODE<1:2>. In detail, the reference voltage VREF generated by the reference voltage generation unit 41 has a first level when the code signals CODE<1:2> have the combination of '00', a second level when the code signals CODE<1:2> have the combination of '01', a third level when the code signals CODE<1:2> have the combination of '10', and a fourth level when the code signals CODE<1:2> have the combination of '11'.

The internal data generation unit 42 is configured to compare the reference voltage VREF and the data DATA<1:4> for the respective levels of the reference voltage VREF and generate internal data IDATA<1:4>. The internal data generation unit 42 may comprise a plurality of comparators which compare the reference voltage VREF with respective bits of the data DATA<1:4> and output the internal data IDATA<1:4>. If a level of the reference voltage VREF is within a range allowing for normal operation, the internal data IDATA<1:4> generated by the internal data generation unit 42 are generated to be the same as the data DATA<1:4>.

The command decoder 43 is configured to generate a write signal WT which is enabled when a write command WT_CMD is inputted and generate a read signal RD which is enabled when a read command RD_CMD is inputted.

The storage unit 44 is configured to sequentially store the internal data IDATA<1:4> to the first to fourth storage sections 441 to 444 in response to combinations of the code signals CODE<1:2> when the write signal WT is enabled. In detail, the internal data IDATA<1:4> generated when the reference voltage VREF has the first level are stored in the first storage section 441. The internal data IDATA<1:4> generated when the reference voltage VREF has the second level are stored in the second storage section 442. The internal data IDATA<1:4> generated when the reference voltage VREF has the third level are stored in the third storage section 443. And, the internal data IDATA<1:4> generated when the reference voltage VREF has the fourth level are stored in the fourth storage section 444.

When the read signal RD is enabled, the storage unit 44 outputs data stored in the first storage section 441 as first storage data SD1<1:4>, data stored in the second storage section 442 as second storage data SD2<1:4>, data stored in the third storage section 443 as third storage data SD3<1:4>, and data stored in the fourth storage section 444 as fourth storage data SD4<1:4>. The first storage section 441, the second storage section 442, the third storage section 443 and the fourth storage section 444 may be realized by storage circuits such as memory cells or registers which are generally known in the art.

The data output unit 45 is configured to compress the first storage data SD1<1:4>, second storage data SD2<1:4>, third storage data SD3<1:4> and fourth storage data SD4<1:4>, and generate the output data DOUT<1:4>. The respective bits included in the output data DOUT<1:4> include information as to whether the levels of the reference voltage VREF comprise a level that is within range for allowing normal operation. For example, the output data DOUT<1> is generated as a logic high level when the first storage data SD1<1:4> has the same level as the data DATA<1:4>, meaning that the first level of the reference voltage VREF comprises a level that is within the range allowing for normal operation.

Figure 9:
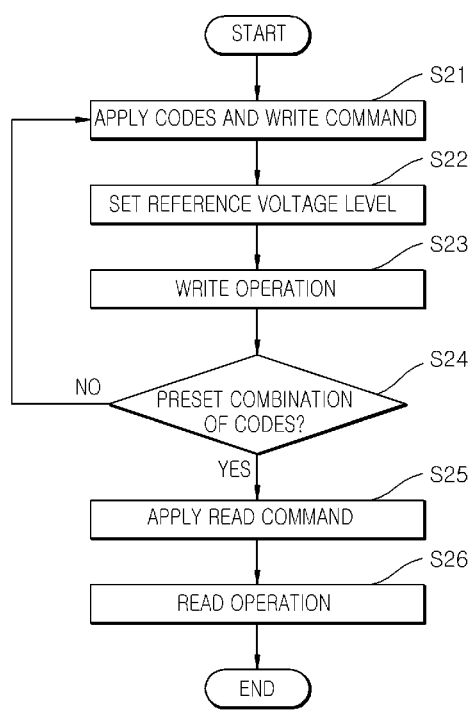
FIGS. 9 and 10 are flow charts explaining reference voltage training processes conducted by the semiconductor system shown in FIG. 7.
Figure 10:
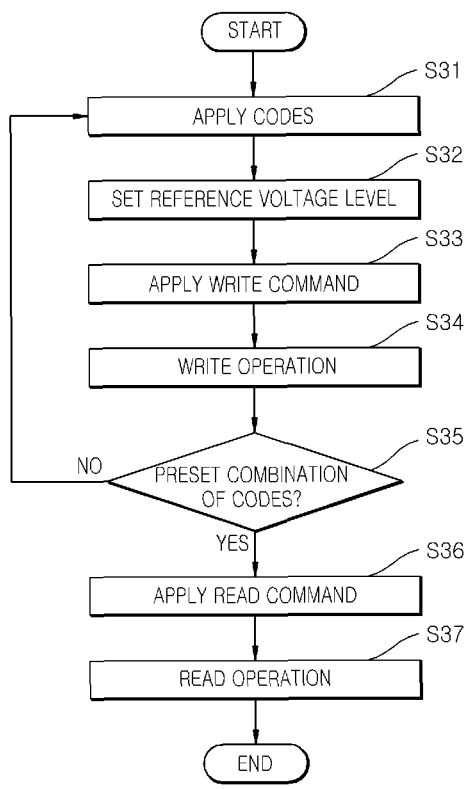

Hereinbelow, a reference voltage training operation conducted in the semiconductor system configured as mentioned above will be described for a case in which the code signals CODE<1:2> and the write command WT_CMD are simultaneously applied as shown in FIG. 9. Reference voltage training is also described for a case in which the write command WT_CMD is applied after the code signals CODE<1:2> are applied as shown in FIG. 10.

A reference voltage training operation in which the code signals CODE<1:2> and the write command WT_CMD are simultaneously applied.

If the code signals CODE<1:2> are initialized to the combination of '00' and the write command WT_CMD is simultaneously applied from the controller 3 (S21), the semiconductor device 4 sets the reference voltage VREF to the first level (S22) and performs the write operation by storing the internal data IDATA<1:4> to the first storage section 241 (S23).

Because the code signals CODE<1:2> are not set to '11' (S24), the controller 3 up-counts the code signals CODE<1: 2> by one bit to generate the combination of '01' and applies the resultant code signals CODE<1:2> to the semiconductor device 4, and the steps S21 to S24 described above are repeated. Accordingly, through these steps, the internal data IDATA<1:4> generated by the reference voltage VREF of the second level are stored in the second storage section 442, the internal data IDATA<1:4> generated by the reference voltage VREF of the third level are stored in the third storage section 443, and the internal data IDATA<1:4> generated by the reference voltage VREF of the fourth level are stored in the fourth storage section 444.

If the code signals CODE<1:2> have the preset combination of '11', the semiconductor device 4 is applied with the read command RD_CMD from the controller 3 (S25). The controller 3 generates the read signal RD which is enabled, and the semiconductor device 4 performs the read operation (S26). Namely, the data stored in the first to fourth storage sections 441 to 444 are outputted as the first to fourth storage data SD1<1:4> to SD4<1:4>, and the first to fourth storage data SD1<1:4> to SD4<1:4> are compressed and outputted as the output data DOUT<1:4>.

Finally, the controller 3 receives the output data DOUT<1: 4>, checks whether the level of the reference voltage VREF is within the range for allowing normal operation, and sets the level of the reference voltage VREF. In other words, in the case where only the output data DOUT<1> among the output data DOUT<1:4> has a logic low level, the levels of the reference voltage VREF allowing the normal operation become the second level, the third level and the fourth level. Thus, the controller 3 sets the level of the reference voltage VREF to one of the second level, the third level and the fourth level.

Turning now to FIG. 10, a reference voltage training operation in which the write command WT_CMD is applied after the code signals CODE<1:2> are applied will be described with reference to FIG. 10.

If the code signals CODE<1:2> are initialized to the combination of '00' and applied from the controller 3 (S31), the semiconductor device 4 sets the reference voltage VREF to the first level (S32). If the write command WT_CMD is applied from the controller 3 (S33), the semiconductor device 4 performs the write operation by storing the internal data IDATA<1:4> generated by the reference voltage VREF with the first level to the first storage section 241 (S34).

Because the code signals CODE<1:2> do not have the preset combination of '11' (S35), the controller 3 up-counts the code signals CODE<1:2> by one bit to generate the combination of '01' and applies the resultant code signals CODE<1:2> to the semiconductor device 4, and the steps S31 to S35 described above are repeated. Accordingly, through these steps, the internal data IDATA<1:4> generated by the reference voltage VREF of the second level are stored in the second storage section 442, the internal data IDATA<1:4> generated by the reference voltage VREF of the third level are stored in the third storage section 443, and the internal data IDATA<1:4> generated by the reference voltage VREF of the fourth level are stored in the fourth storage section 444.

If the code signals CODE<1:2> have the preset combination of '11', the semiconductor device 4 is applied with the read command RD_CMD from the controller 3 (S36), the controller 3 generates the read signal RD which is enabled, and the semiconductor device 4 performs the read operation (S37). Namely, the data stored in the first to fourth storage sections 441 to 444 are outputted as the first to fourth storage data SD1<1:4> to SD4<1:4>, and the first to fourth storage data SD1<1:4> to SD4<1:4> are compressed and outputted as the output data DOUT<1:4>.

Finally, the controller 3 receives the output data DOUT<1:4>, checks whether the level of the reference voltage VREF is within a range allowing the normal operation, and the controller 3 sets the level of the reference voltage VREF. In other words, in the case where only the output data DOUT<4> among the output data DOUT<1:4> has a logic low level, the levels of the reference voltage VREF allowing the normal operation become the first level, the second level and the third level. Thus, the controller 3 sets the level of the reference voltage VREF to one of the first level, the second level and the third level.

As is apparent from the above descriptions, according to embodiments of the present invention, reference voltage training is conducted in such a manner that, after storing all the data inputted in response to reference voltages set for respective combinations of code signals, the stored data are simultaneously outputted through one read operation, whereby a time required for reference voltage training can be shortened and current consumption can be reduced.

Embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for conducting reference voltage training, comprising:
a first action of setting levels of a reference voltage in response to code signals and receiving and storing data for the respective levels of the reference voltage; and
a second action of compressing the stored data and simultaneously outputting output data,
wherein the output data includes information as to whether the stored data have a same combination as the received data.

2. The method according to claim 1, wherein the first action further comprises:
generating the reference voltage with a first level in response to a first combination of the code signals, and generating the reference voltage with a second level in response to a second combination of the code signals;
generating a write signal which is enabled when the code signals have the first combination, and generating the write signal and a read signal which are sequentially enabled when the code signals have the second combination; and
receiving and storing the data in response to the reference voltage with the first level and receiving and storing the data in response to the reference voltage with the second level, when the write signal is enabled.

3. The method according to claim 2, wherein the second action comprises compressing the stored data and outputting the stored data.

4. The method according to claim 3, wherein the second action further comprises:
outputting the stored data as first storage data in response to the reference voltage with the first level and outputting the stored data as second storage data in response to the reference voltage with the second level, when the read signal is enabled; and
compressing the first and second storage data and outputting output data.

5. The method according to claim 4, wherein the output data have 2 bits, one bit of the output data includes information as to whether the first storage data have a same combination as the data, and the other bit of the output data includes information as to whether the second storage data have a same combination as the data.

6. The method according to claim 1, wherein the first action comprises:
generating the reference voltage with a first level in response to a first combination of the code signals, and generating the reference voltage with a second level in response to a second combination of the code signals;
generating a write signal which is enabled when a write command is inputted, and generating a read signal which is enabled when a read command is inputted; and
receiving and storing the data in response to the reference voltage with the first level and receiving and storing the data in response to the reference voltage with the second level, when the write signal is enabled.

7. The method according to claim 6, wherein the second action further comprises:
outputting the stored data as first storage data in response to the reference voltage with the first level and outputting the stored data as second storage data in response to the reference voltage with the second level, when the read signal is enabled; and
compressing the first and second storage data and outputting the output data.

8. The method according to claim 7, wherein the output data have 2 bits, one bit of the output data includes information as to whether the first storage data have a same combination as the data, and the other bit of the output data includes information as to whether the second storage data have a same combination as the data.

9. A method for conducting reference voltage training, comprising:
applying a first combination of codes;
generating a write signal which is enabled by the first combination of codes, and performing a first write operation by receiving and storing data in response to a reference voltage with a first level which is generated by the first combination of codes;
applying a second combination of codes;
generating a write signal which is enabled by the second combination of codes, and performing a second write operation by receiving and storing data in response to a reference voltage with a second level which is generated by the second combination of codes; and
generating a read signal which is enabled by the second combination of codes, and performing a read operation by outputting the data stored in the first and second write operations as output data,
wherein the output data includes information as to whether the stored data have a same combination as the received data.

10. The method according to claim 9, wherein the performing of the read operation comprises:
outputting the data stored in the first write operation as first storage data, and outputting the data stored in the second write operation as second storage data; and
compressing the first and second storage data and outputting the output data.

11. The method according to claim 10, wherein the output data have 2 bits, one bit of the output data includes information as to whether the first storage data have a same combination as the data, and the other bit of the output data includes information as to whether the second storage data have a same combination as the data.

12. A method for conducting reference voltage training, comprising:
- applying a plurality of combination codes and a plurality of write commands;
- generating a plurality of write signals enabled by the plurality of write commands, and performing a plurality of write operations by receiving and storing data in response to a plurality of reference voltages comprising a plurality of levels generated by the plurality of combination codes;
- applying a read command; and
- generating a read signal which is enabled by the read command, and performing a read operation by outputting the data stored in the plurality of write operations as output data,
- wherein the output data includes information as to whether the stored data have a same combination as the received data.

13. The method according to claim 12, wherein the performing of the read operation comprises:
- outputting the data stored in a first of the plurality of write operations as first storage data, and outputting the data stored in a second of the plurality of write operations as second storage data; and
- compressing the first and second storage data and outputting the output data.

14. The method according to claim 13, wherein the output data have 2 bits, one bit of the output data includes information as to whether or not the first storage data have a same combination as the data stored in the first of the plurality of write operations, and the other bit of the output data includes information as to whether or not the second storage data have a same combination as the data stored in the second of the plurality of write operations.

15. A method for conducting reference voltage training, comprising:
- applying a first combination of codes;
- generating a reference voltage with a first level by the first combination of codes;
- applying a first write command;
- generating a write signal which is enabled by the first write command, and performing a first write operation by receiving and storing data in response to the reference voltage with the first level;
- applying a second combination of codes;
- generating a reference voltage with a second level by the second combination of codes;
- applying a second write command;
- generating a write signal which is enabled by the second write command, and performing a second write operation by receiving and storing data in response to the reference voltage with the second level;
- applying a read command; and
- generating a read signal which is enabled by the read command, and performing a read operation by outputting the data stored in the first and second write operations as output data,
- wherein the output data includes information as to whether the stored data have a same combination as the received data.

16. The method according to claim 15, wherein the performing of the read operation comprises:
- outputting the data stored in the first write operation as first storage data, and outputting the data stored in the second write operation as second storage data; and
- compressing the first and second storage data and outputting the output data.

17. The method according to claim 16, wherein the output data have 2 bits, one bit of the output data includes information as to whether or not the first storage data have a same combination as the data, and the other bit of the output data includes information as to whether or not the second storage data have a same combination as the data.

* * * * *